(12) United States Patent
Durham et al.

(10) Patent No.: US 6,181,156 B1
(45) Date of Patent: Jan. 30, 2001

(54) NOISE SUPPRESSION CIRCUITS FOR SUPPRESSING NOISES ABOVE AND BELOW REFERENCE VOLTAGES

(75) Inventors: Christopher McCall Durham; Peter Juergen Klim, both of Austin, TX (US)

(73) Assignee: International Business Machines Corporation, Armonk, NY (US)

(*) Notice: Under 35 U.S.C. 154(b), the term of this patent shall be extended for 0 days.

(21) Appl. No.: 09/282,269

(22) Filed: Mar. 31, 1999

(51) Int. Cl.[7] .............................. H03K 17/16; H03K 5/08; G01R 29/02

(52) U.S. Cl. .................................. 326/27; 326/27; 326/26; 326/28; 326/86; 326/87; 327/34; 327/310; 327/312

(58) Field of Search .................................. 326/26, 27, 28, 326/31, 82, 86, 87; 327/34, 310, 312, 316, 321, 323

(56) References Cited

U.S. PATENT DOCUMENTS 5,065,048 * 11/1991 Asai et al. .............................. 307/443
5,646,557 * 7/1997 Runyon et al. .......................... 326/97
5,734,277 * 3/1998 Hu et al. ................................ 327/108
5,793,226 * 8/1998 Park et al. ............................. 326/86
5,933,021 * 8/1999 Mohd ...................................... 326/30

* cited by examiner

Primary Examiner—Michael Tokar
Assistant Examiner—Vibol Tan
(74) Attorney, Agent, or Firm—Casimer K. Salys; Felsman, Bradley, Vaden, Gunter & Dillon, LLP

(57) ABSTRACT

A noise suppression circuit for suppressing noises above and below reference voltages is disclosed. The noise suppression circuit for suppressing noises includes a means for generating a power-on-reset signal, a clamping transistor, and a feedback circuit. The means for generating a power-on-reset signal presets an internal latch of the noise suppression circuit to a predetermined state, such as a logical high state. The clamping transistor restores the state of a data input of a circuit to which the noise suppression circuit is providing protection, after the occurrence of a noise coupling event. The feedback circuit then turns off the clamping transistor after a predetermined amount of time.

11 Claims, 4 Drawing Sheets

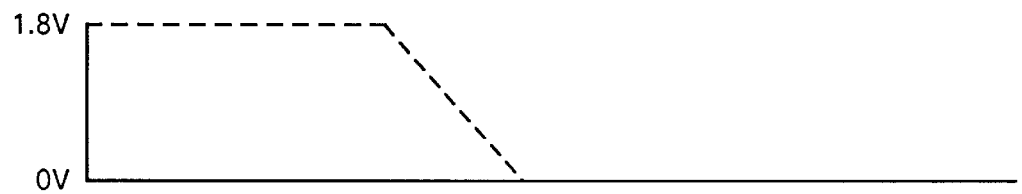
Fig. 2A
Fig. 2B
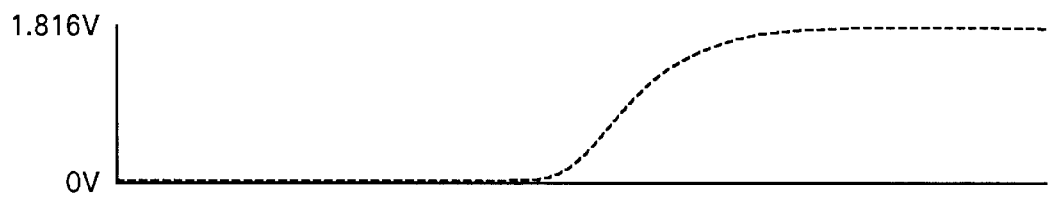
Fig. 2C
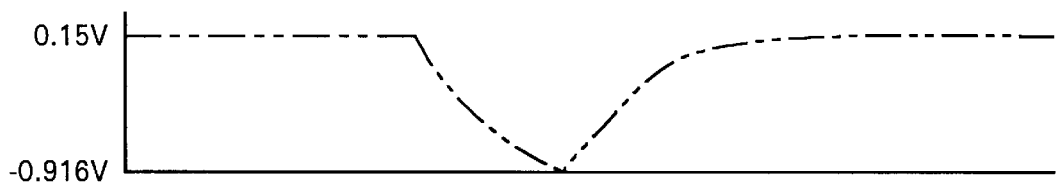
Fig. 2D
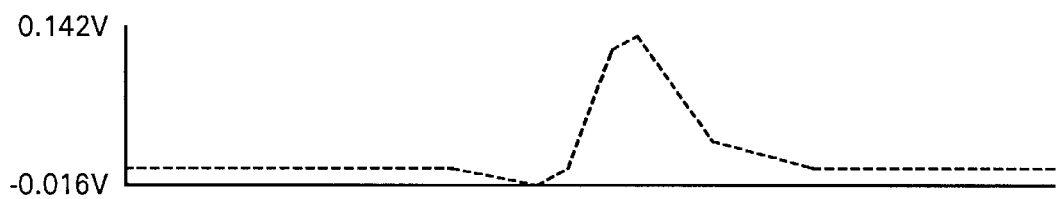
(Prior Art) Fig. 2E

NOISE SUPPRESSION CIRCUITS FOR SUPPRESSING NOISES ABOVE AND BELOW REFERENCE VOLTAGES

BACKGROUND OF THE INVENTION

1. Technical Field

The present invention relates to electronic circuits in general, and in particular to noise suppression circuits. Still more particularly, the present invention relates to noise suppression circuits for suppressing above-supply and below-ground noises.

2. Description of the Prior Art

As electronic circuits continue to reduce in size, metallurgical limitations begin to have more influence on line-to-line interconnect coupling. At a minimum, line-to-line interconnect coupling can increase effective load capacitance if a signal line is switching when a neighboring net is concurrently switching in an opposite direction from the signal line. As a result, there will be an increase in switching time for the signal line.

Furthermore, line-to-line interconnect coupling can also cause noise. Generally speaking, noise can bounce in one or more of the following four distinct directions: above ground, below ground, above power supply, and below power supply. Noises that are above ground and below power supply can cause false switching events if the coupling effects cause a signal to cross the switching threshold of a given destination circuit. On the other hand, noises that are below ground and above power supply can cause a loss of state in some types of latch circuits.

Thus, it is desirable to eliminate those effects, such as noises, that are caused by the line-to-line interconnect coupling. The present invention provides a noise suppression circuit for suppressing noises that are above power supply and a noise suppression circuit for suppressing noises that are below ground.

SUMMARY OF THE INVENTION

In accordance with a preferred embodiment of the present invention, a noise suppression circuit for suppressing noises includes a means for generating a power-on-reset signal, a clamping transistor, and a feedback circuit. The means for generating a power-on-reset signal presets an internal latch of the noise suppression circuit to a predetermined state, such as a logical high state. The clamping transistor restores the state of a data input of a circuit to which the noise suppression circuit is providing protection, after the occurrence of a noise coupling event. The feedback circuit then turns off the clamping transistor after a predetermined amount of time.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein:

FIGS. 2a–2e are waveform diagrams depicting various simulation results of latch circuit 10 from FIG. 1;

DETAILED DESCRIPTION OF A PREFERRED EMBODIMENT

Figure 1:
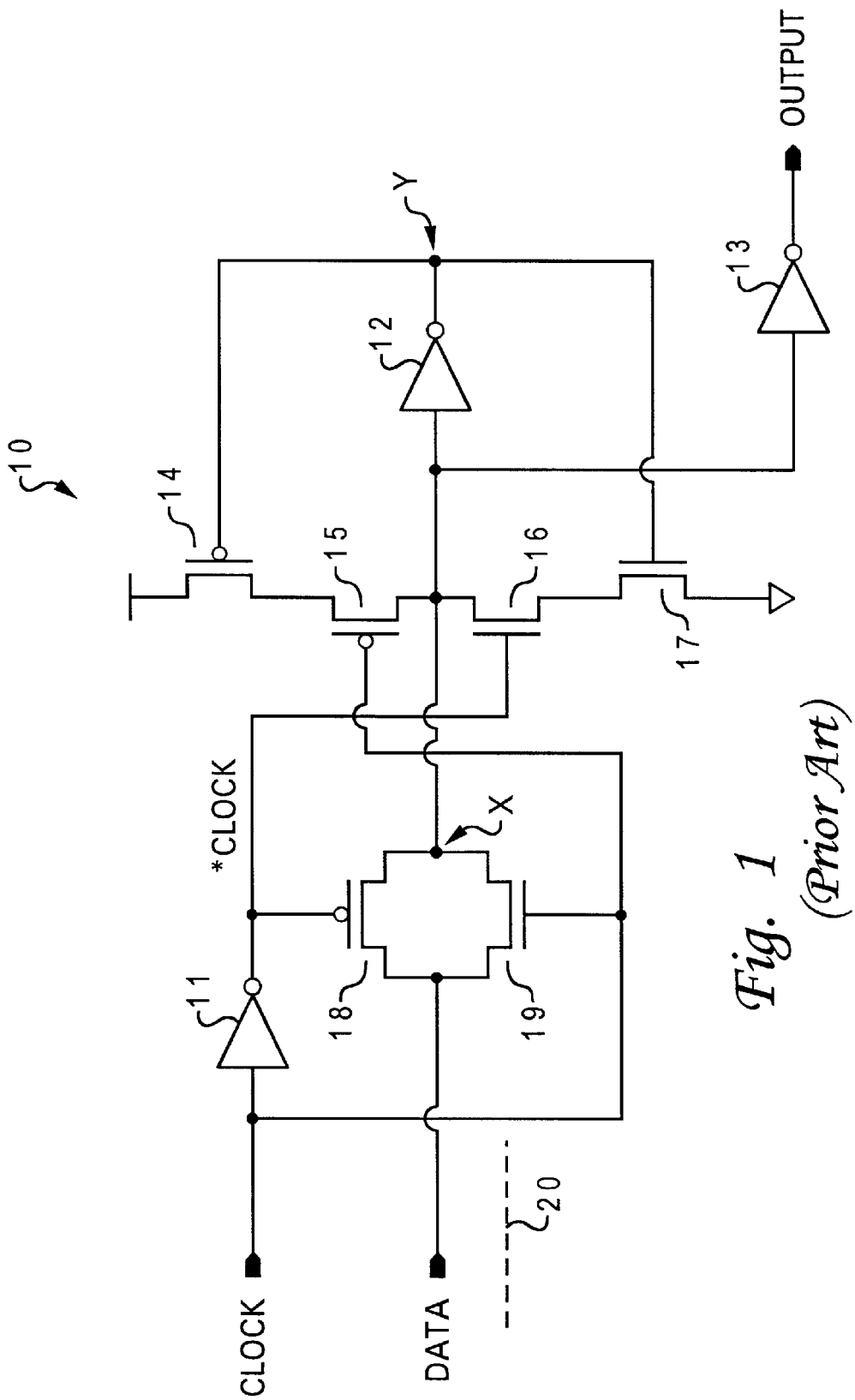
FIG. 1 is a circuit diagram of a conventional latch circuit.

The present invention can be illustrated via a conventional latch circuit. Referring now to the drawings and in particular to FIG. 1, there is illustrated a circuit diagram of a conventional latch circuit. As shown, latch circuit 10 includes inverters 11–13 and transistors 14–19. Latch circuit 10 also includes a clock input, a data input, and an output. Typically, when the clock signal is low, the state of the data input is stored in node X. When the clock signal is high, the state of node X (i.e., the previous state of the data input) is allowed to pass through to the output (with an inversion).

For example, when the clock signal is high and the *clock signal is low, p-channel transistor 18 and n-channel transistor 19 are turned on, which allows the data input to propagate to node X. Additionally, the high clock signal turns off p-channel transistor 15 and the low *clock signal turns off n-channel transistor 16, breaking the feedback loop from node Y to node X. Thus, inverter 12 can force the inverted state on node X to be seen on node Y, and inverter 13 causes the inverted state of node X to propagate to the output.

When the clock signal is low and the *clock signal is high, both transistors 18 and 19 are turned off, and this isolates the input data from node X. Because the clock signal is low and the *clock signal is high, transistors 15 and 16 are now turned on. If, at this time, node Y is low (meaning node X was in a high state prior to the clock signal going low), p-channel transistor 14 will be turned on, providing a feedback loop from node Y to node X to maintain the high state at node X. Similarly, if node Y is high, then n-channel transistor 17 will be turned on, providing a feedback loop from node Y to node X to maintain a low state at node X. Note that the output will follow node X via inverter 13. In this way, the logical state of the data input is stored at node X and appears at the output while the clock signal is low.

The logical state at node X will usually remain the same until the clock signal goes high again. However, in certain noise coupling situations, the state of node X can be lost. For example, if node X is at a high state (so the output is at a low state) while the clock signal is low, then transistor 19 is turned off. Even if the data input goes low at this time, the high state at node X can still be maintained because there is no path connected between node X and the data input. But if a signal line 20 adjacent to the data input now quickly transitions to a low state, the data input will be noise coupled below ground. At this point, when the clock signal is still low, if the gate to source voltage on transistor 18 is above the threshold during the noise coupling, then transistor 18 will be turned on, however, briefly. Furthermore, if the amplitude of the noise coupled voltage (typically set by the value of the coupling capacitance, the transition time of signal line 20, and the strength of the pull down circuit on the data input) and its duration (determined by the RC time constant of the data input line) are sufficient, the high state stored in node X will become low. This means the latched state of latch circuit 10 has been lost.

With reference now to FIGS. 2a–2c, there are illustrated several waveforms depicting the simulation results of latch circuit 10 from FIG. 1. As shown, coupling signal line 20 switches to a low state (FIG. 2a), which causes an unprotected data input to bounce below ground (FIG. 2b). The output of latch circuit 10 now goes to a high state errantly (FIG. 2c) due to loss of the high state at node X. In a similar fashion, the output of latch circuit 10 can go to a high state errantly due to the loss of a low state at node X caused by an above supply coupling (not shown).

One way to solve the noise coupling problem is to add some kind of buffering circuits at the input of latch circuit 10. Although effective, this solution has an adverse effect of inserting additional delay to latch circuit 10. Another way to solve the noise coupling problem is to eliminate any potential noise coupling problem to the data input. This solution involves the removal of any signal wire that is adjacent to the data input. Although this is also a very effective technique, problems in wiring critical areas prevents this technique to be an universal solution. Consequently, there exists a need to prevent those noise coupling events from causing the loss of state in latch circuit 10 of FIG. 1.

In accordance with a preferred embodiment of the present invention, a noise suppression circuit is added to latch circuit 10. The noise suppression circuit can continually monitor the circuit condition of latch circuit 10 and automatically provides a correction to a noise problem when necessary. A noise suppression circuit for suppressing below ground noise is shown in FIG. 3 while a noise suppression circuit for suppressing above power supply noise is shown in FIG. 4.

Figure 3:
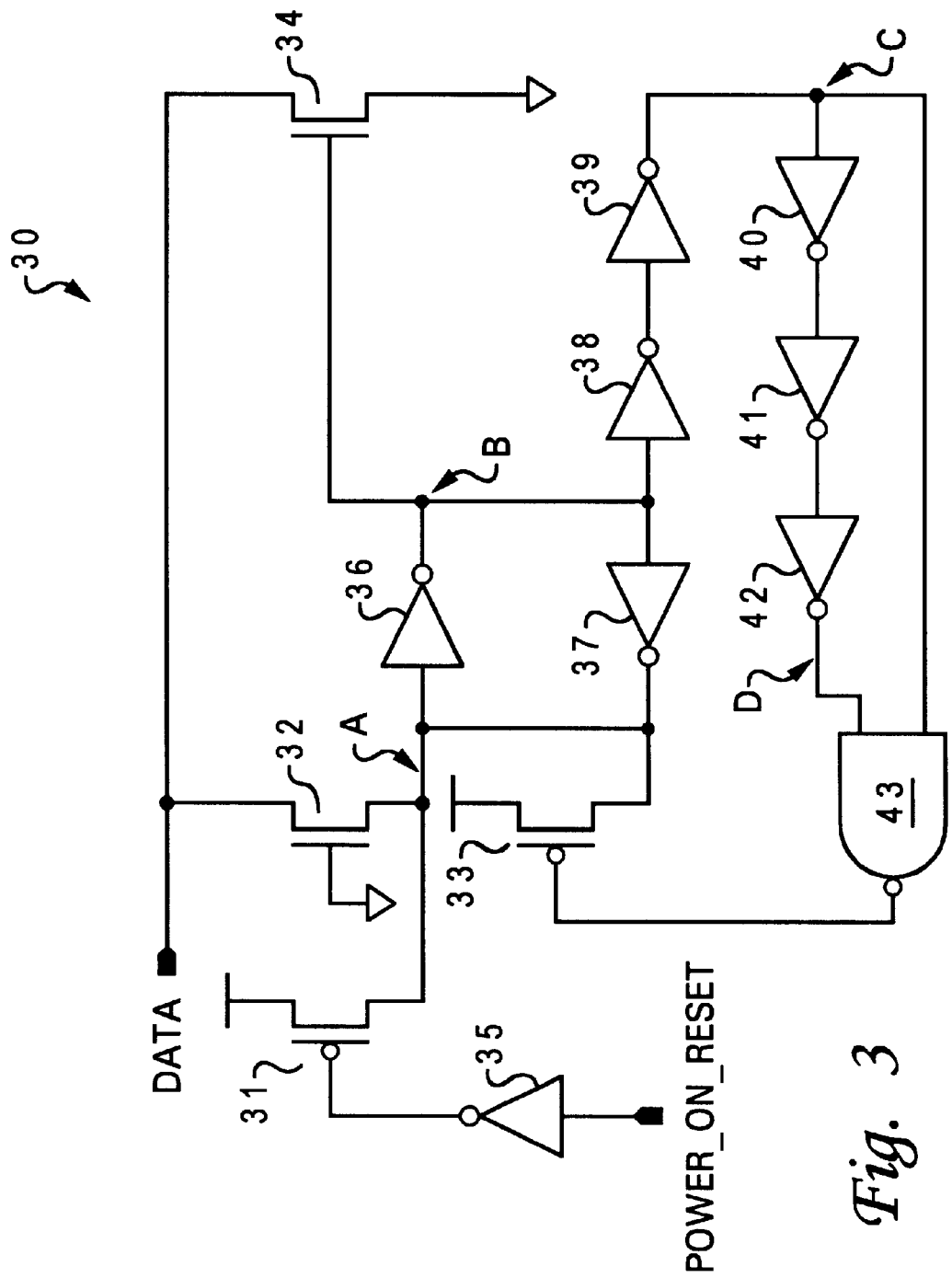
FIG. 3 is a circuit diagram of a noise suppression circuit for suppressing below ground noises, in accordance with a preferred embodiment of the present invention.
Figure 4:
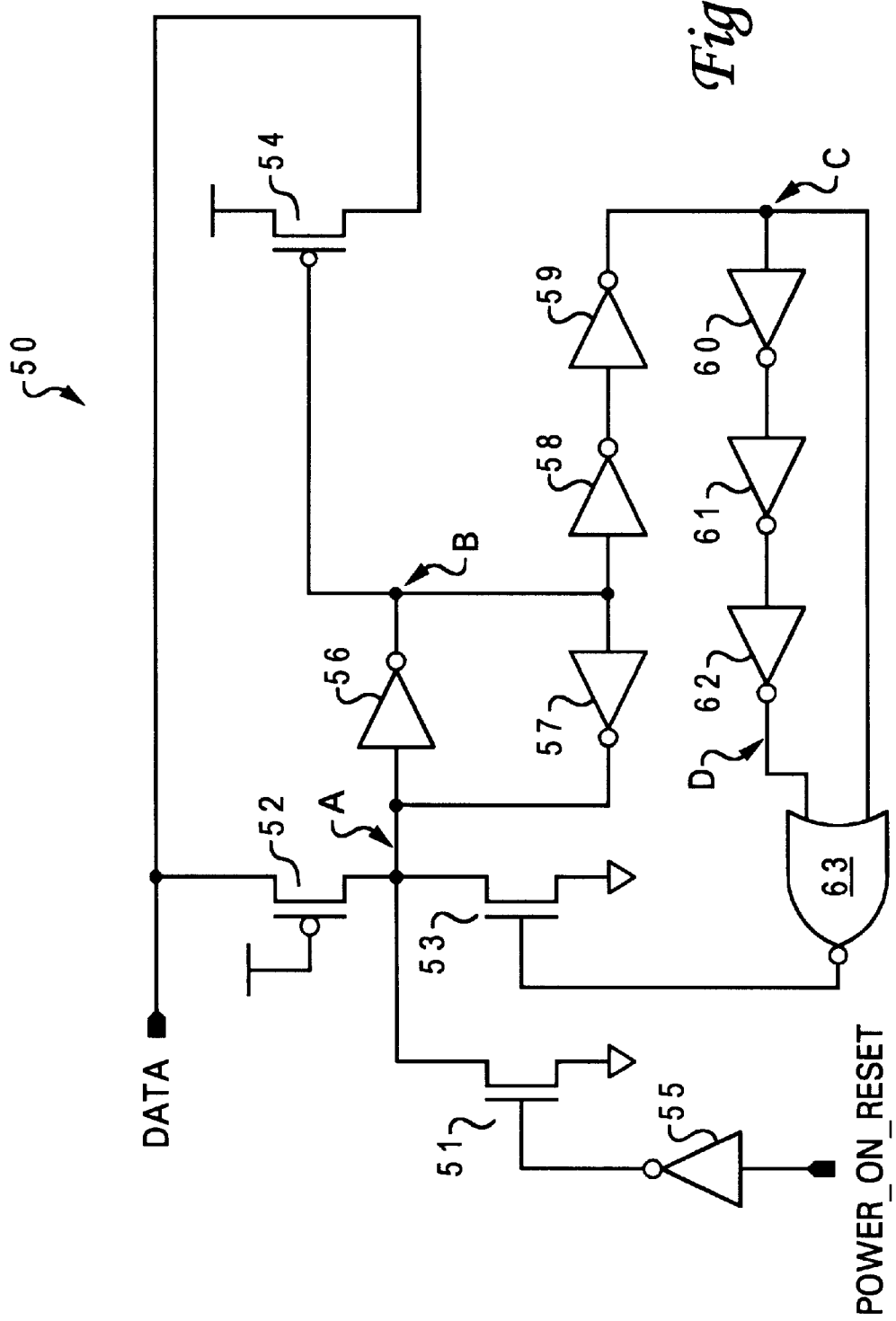
FIG. 4 is a circuit diagram of a noise suppression circuit for suppressing above power supply noises, in accordance with a preferred embodiment of the present invention.

Referring now to FIG. 3, there is illustrated a circuit diagram of a noise suppression circuit for suppressing below ground noise, in accordance with a preferred embodiment of the present invention. As shown, a noise suppression circuit 30 is constructed as a sampling latch similar to latch circuit 10 of FIG. 1, except noise suppression circuit 30 is designed to lose its state much quicker than latch circuit 10. Additionally, noise suppression circuit 30 includes a power-on-reset signal along with a p-channel transistor 31 and an inverter 35 for presetting an internal latch to a logical "1" state. A clamping n-channel transistor 34 is also included to restore the state of the data input of the circuit being protected after the occurrence of a noise coupling event. Furthermore, a feedback system is included to turn off clamping n-channel transistor 34 and to restore the high state of the circuit being protected after a predetermined amount of time, e.g., 1 ns, using inverters 38–42, a two-input NAND gate 43, and a p-channel transistor 33.

Initially, the power-on-reset signal is pulsed high when noise suppression circuit 30 is powered on. The technique for generating such a signal pulse is well-known to those skilled in the relevant art. The power-on-reset pulse sets node A to a high state via a p-channel transistor 32. Node B then transitions low due to the operation of an inverter 36. A feedback inverter 37 then drives node A to a high state again such that the high state at node A is retained. Because node B is low, n-channel transistor 34 is turned off, and current is prevented from flowing through transistor 34 to ground. In addition, inverters 38 and 39 force node C to a low state because node B is at a low state. Because node C is at a low state, inverters 40–42 set node D to a high state. Because NAND gate 43 now receives a low state from node C and a high state from node D, the output of NAND gate 43 is high. As a result, p-channel transistor 33 is turned off.

When noise from a signal line adjacent to the data input, such as signal line 20 from FIG. 1, couples to the data input with sufficient amplitude below ground (i.e., a threshold voltage of an n-channel transistor as determined by the process technology), n-channel transistor 32 receives a voltage between its gate (tied to ground) and its source (tied to the data input) greater than or equal to its threshold voltage. If this voltage is of sufficient duration in terms of pulse width, node A will transition from a high state to a low state. When node A goes to a low state, inverter 36 causes node B to go to a high state. When node B is at a high state, n-channel transistor 34 turns on and returns the data input back to ground (from its below ground starting point). As a result, the duration of the noise pulse on the data input will be reduced significantly. Compared to the unprotected data input in FIG. 1, a protected data input using noise suppression circuit 30 of FIG. 3 returns to ground in a much shorter time. Transistor 34 remains on until the latch formed by inverters 36 and 37 is reset to a high value, which forces node A to a high state and node B at a low state.

When node B goes to a high state, inverters 38–39 force node C high after a slight delay. This delay is introduced to prevent the latch (i.e., inverters 36 and 37) from resetting too quickly. This is because if the latch resets immediately, then transistor 34 will be turned on only very briefly, and its effectiveness at drawing the data input back to ground will be reduced. When node C is at a high state, NAND gate 43 briefly receives a high state on both node C and node D, causing the output pulse from NAND gate 43 to go to a low state. When the output pulse from NAND gate high state. Note that the output pulse from NAND gate 43 will be low only until node D goes low via inverters 40–42 in response to node C being high. Thus, NAND gate 43 and inverters 40–42 form a rising-edge-triggered one-shot pulse generator with a pulse duration equal to the delay through inverters 40–42.

Furthermore, when the output pulse from NAND gate 43 turns on transistor 33, node A is forced to be high again. Thus, node B becomes low via inverter 36, and inverter 37 holds the high state at node A. Transistor 34 is now turned off, ending the noise attenuation on the data input. Note that the amount of time transistor 34 should be turned on is determined by the response time through inverters 36, 38, 39, NAND gate 43, and transistor 33. "C" is now also forced low, later forcing "D" high. NAND gate 43 now receives a high and a low value, and no pulse is generated because NAND gate 43 never receives a high value on both inputs at this time. At this time, noise suppression circuit 30 of FIG. 3 is ready to suppress other below ground noise coupling events again.

There are several important aspects regarding the construction of noise suppression circuit 30. First, the omission of a p-channel transistor in the clocked transmission gate (as in transistor 18 in FIG. 1) is intentional. Because the transmission gate is turned off and the loss of a high state is being detected, the p-channel transistor is not necessary. Additionally, inverters 40–42, in conjunction with NAND gate 43 form a rising-edge-triggered one-shot pulse generator. Inverters 38 and 39 serve to delay the signal into the one shot pulse generation to prevent the restoration of the latch to a high state too quickly, as mentioned previously.

Referring back to FIGS. 2a–2e, FIG. 2e is the output waveform of a latch circuit 10 from FIG. 1 having its data input connected to noise suppression circuit 30, in accordance with a preferred embodiment of the present invention. When comparing the unprotected data input (FIG. 2b) to the protected node (FIG. 2d), the unprotected data input drops to −1.093 V due to below ground noise while the protected node also drops to −0.916 V, which is not that much of a difference. This means that the amplitude of the noise coupling event is not significantly affected. However, note that the recovery time of the noise coupling event is much less. That is, the resulting rising slew rate of the protected data input is much higher than the unprotected input. This means that the energy contained in the noise event in the data input to the protected circuit is much less, thereby reducing the probability of failure. This can be seen as the output of the protected circuit rises to only 0.142 V due to the noise coupling event, but quickly retains the low state on the output (FIG. 2e). On the other hand, the output of the unprotected latch switches to the full supply voltage (FIG. 2c), and the latched state is lost as a result.

With reference now to FIG. 4, there is illustrated a noise suppression circuit for suppressing above power supply noises, in accordance with a preferred embodiment of the present invention. Noise suppression circuit 40 is similar to noise suppression circuit 30 of FIG. 3 and operates as follows. During power up, a power-on-reset input is pulsed high, which turns on an n-channel transistor 51. This pulls node A to a low state and sets node B to a high state, while node C is in a high state and node D is in a low state. As a result, p-channel transistor 54 is turned off. NOR gate 63 receives a high input, so the output from NOR gate 63 is low, keeping n-channel transistor 53 off.

If an above supply noise event occurs on the data input and is greater than the threshold of p-channel transistor 52 (as determined by the process technology), p-channel transistor 52 will be turned on, pulling node A to a high state. The high state of node A then forces node B to a low state, turning p-channel transistor 54 on, which draws the data input back to the supply voltage level. In addition, the low state of node B causes node C to go to a low state. NOR gate 63 receives two low values for a brief time, or until node D is forced to a high state due to node C being in a low state. Thus, the pulse from NOR gate 63 will pulse high for a short amount of time, forcing node A to a low state. The low state of node A causes node B to go to a high state, turning off transistor 54. Also, the high state of node B causes node C to be at a high state, which later causes node D to be in a low state. Because NOR gate 63 does not receive two high values, the output from NOR gate 63 remains in a low state. At this point, noise suppression circuit 40 is ready to suppress other above supply noise coupling events.

As has been described, the present invention provides an active noise suppression circuit for below ground noises and an active noise suppression circuit for above power supply noises. Both noise suppression circuits can work in conjunction with each other and an associated data input line will only be loaded with two small diffusion capacitances. Although a latch circuit is used to illustrate the present invention, both noise suppression circuits are applicable to any type of circuit in which a state needs to be maintained in the presence of noise.

While the invention has been particularly shown and described with reference to a preferred embodiment, it will be understood by those skilled in the art that various changes in form and detail may be made therein without departing from the spirit and scope of the invention.

What is claimed is:

1. A noise suppression circuit, comprising:
   an internal latch;
   means for generating a power-on-reset signal to preset said internal latch to a predetermined state;
   a clamping transistor for restoring the state of a data input to which the noise suppression circuit is providing protection, after an occurrence of a noise coupling event; and
   a feedback circuit, coupled between said generating means and said clamping transistor, for turning off said clamping transistor after a predetermined amount of time.

2. The noise suppression circuit according to claim 1, wherein said predetermined state is a logical high state.

3. The noise suppression circuit according to claim 1, wherein said internal latch includes two inverters.

4. The noise suppression circuit according to claim 1, wherein said generating means includes a p-channel transistor and an inverter for suppressing below ground noises.

5. The noise suppression circuit according to claim 1, wherein said generating means includes an n-channel transistor and a buffer for suppressing above power supply noises.

6. The noise suppression circuit according to claim 1, wherein said clamping transistor is an n-channel transistor for suppressing below ground noises.

7. The noise suppression circuit according to claim 1, wherein said clamping transistor is a p-channel transistor for suppressing above power supply noises.

8. The noise suppression circuit according to claim 1, wherein said feedback circuit includes a plurality of inverters, a two-input NAND gate, and a p-channel transistor for suppressing below ground noises.

9. The noise suppression circuit according to claim 1, wherein said feedback circuit includes a plurality of inverters, a two-input NOR gate, and an n-channel transistor for suppressing above power supply noises.

10. A method for suppressing a noise coupling event from a circuit, said method comprising the steps of:
    generating a power-on-reset signal to preset an internal latch to a predetermined state;
    restoring the state of a data input of said circuit after an occurrence of said noise coupling event; and
    turning off said restoring step after a predetermined amount of time.

11. The method according to claim 10, wherein said predetermined state is a logical high state.

* * * * *